(12) United States Patent
Feinstein et al.

(10) Patent No.: US 8,875,652 B2
(45) Date of Patent: Nov. 4, 2014

(54) LIQUID ADHESIVE BOUNDARY CONTROL

(75) Inventors: Casey J. Feinstein, San Jose, CA (US);
Kuo-Hua Sung, San Jose, CA (US);
Ralf Horstkemper, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 416 days.

(21) Appl. No.: 13/232,902

(22) Filed: Sep. 14, 2011

(65) Prior Publication Data

US 2013/0064967 A1    Mar. 14, 2013

(51) Int. Cl.

| | |
|---|---|
| *B05C 9/08* | (2006.01) |
| *B05C 11/00* | (2006.01) |
| *B05C 3/18* | (2006.01) |
| *C23C 16/52* | (2006.01) |
| *B29C 65/00* | (2006.01) |
| *B29C 65/14* | (2006.01) |
| *B05C 9/12* | (2006.01) |
| *C23C 14/02* | (2006.01) |
| *C08J 7/18* | (2006.01) |
| *C09J 5/00* | (2006.01) |
| *H01L 23/00* | (2006.01) |
| *B32B 7/12* | (2006.01) |
| *B29C 65/48* | (2006.01) |
| *B29L 31/34* | (2006.01) |
| *B29C 65/52* | (2006.01) |

(52) U.S. Cl.
CPC .............. *B05C 9/12* (2013.01); *B29C 65/1496* (2013.01); *B29C 65/1448* (2013.01); *B05C 3/18* (2013.01); *B32B 7/12* (2013.01); *B29C 65/4845* (2013.01); *C23C 14/02* (2013.01); *B29C 65/1406* (2013.01); *C08J 7/18* (2013.01); *B29C 66/45* (2013.01); *B29L 2031/3475* (2013.01); *B29C 65/52* (2013.01); *B05C 11/00* (2013.01); *B29C 66/8322* (2013.01); *C09J 5/00* (2013.01); *B29C 65/1464* (2013.01); *B29C 65/1435* (2013.01); *H01L 24/00* (2013.01); *B29C 66/324* (2013.01); *B29C 66/345* (2013.01)
USPC ........... 118/620; 118/668; 118/669; 118/688; 118/699; 118/712; 118/713; 118/407; 118/402; 427/553; 427/8; 427/510; 250/338.4; 156/275.5

(58) Field of Classification Search
CPC .......... B05C 9/12; B05C 3/18; B05C 11/00; B29C 65/1435; C08J 7/18
USPC ............... 118/620, 624, 688–690; 156/275.5; 427/553, 510, 8; 250/338.4
See application file for complete search history.

(56) References Cited

U.S. PATENT DOCUMENTS 5,259,169 A * 11/1993 Appelbaum et al. ....... 156/379.8
5,483,261 A    1/1996 Yasutake (Continued)

FOREIGN PATENT DOCUMENTS

| JP | 2000-163031 A | 6/2000 |
| JP | 2002-342033 A | 11/2002 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Dah-Wei D Yuan
*Assistant Examiner* — Binu Thomas
(74) *Attorney, Agent, or Firm* — Michael H. Lyons (57) ABSTRACT

A system for controlling a boundary of spreading liquid adhesive on a surface is disclosed. The system includes one or more ultra-violet (UV) sources configurable to emit UV light onto the liquid adhesive; and a control circuit coupled to the one or more UV sources and configured to control the one or more UV sources to selectively apply the UV light at selected locations on the liquid adhesive to cure the adhesive and prevent its further spread at those locations.

14 Claims, 6 Drawing Sheets

(56) References Cited

U.S. PATENT DOCUMENTS

| | | |
|---|---|---|
| 5,488,204 A | 1/1996 | Mead et al. |
| 5,825,352 A | 10/1998 | Bisset et al. |
| 5,835,079 A | 11/1998 | Shieh |
| 5,880,411 A | 3/1999 | Gillespie et al. |
| 5,882,451 A * | 3/1999 | Sasaki et al. ............ 156/64 |
| 6,188,391 B1 | 2/2001 | Seely et al. |
| 6,310,610 B1 | 10/2001 | Beaton et al. |
| 6,323,846 B1 | 11/2001 | Westerman et al. |
| 6,690,387 B2 | 2/2004 | Zimmerman et al. |
| 7,015,894 B2 | 3/2006 | Morohoshi |
| 7,184,064 B2 | 2/2007 | Zimmerman et al. |
| 7,663,607 B2 | 2/2010 | Hotelling et al. |
| 7,722,939 B2 | 5/2010 | Schwantes et al. |
| 8,119,214 B2 | 2/2012 | Schwantes et al. |
| 2003/0149505 A1* | 8/2003 | Mogensen ............ 700/117 |
| 2004/0129382 A1* | 7/2004 | Terashi et al. ........... 156/275.5 |
| 2006/0026521 A1 | 2/2006 | Hotelling et al. |
| 2006/0197753 A1 | 9/2006 | Hotelling |
| 2010/0320386 A1* | 12/2010 | Gaon ............ 250/338.4 |
| 2011/0151202 A1* | 6/2011 | Feinstein et al. ......... 118/600 |

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI ' 92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

LIQUID ADHESIVE BOUNDARY CONTROL

FIELD

This relates generally to the fabrication of circuit panels, and more particularly, to controlling the boundary of liquid adhesive during lamination.

BACKGROUND

Electronic devices can generally include at least one substrate with another substrate and/or electrical components adhered thereto. Fabrication of substrates can involve applying an adhesive to a surface of a substrate and using the applied adhesive to adhere another substrate and/or electrical component to the substrate surface. Liquid adhesive is sometimes preferred because of its flowability and compliance, which allows the adhesive to easily cover many different substrate configurations. However, liquid adhesive's flowability can also be problematic because of the difficulty in controlling its boundary as it spreads between two substrates under pressure. Any overflow or underfill of the liquid adhesive during fabrication could cause certain defects in the final product. For example, if the adhesive overflows a designated boundary, it could interact with other layers or components of the device, and produce unintended effects in the device being fabricated. Similarly, if the liquid adhesive underfills a desired area, i.e., if the adhesive fails to reach the intended boundary, it may result in defects such as visible lines in the display area of the device.

Currently, very few boundary control mechanisms exist for controlling the spread of liquid adhesive during manufacturing. One common way to deal with overflow is to simply remove the excess adhesive that has overflowed the intended boundary. However, if the cleaning is not done thoroughly, there could be residue left in the laminate that could affect the quality of the overall device. Sometimes, the laminate can be contaminated if the cleaning is not carried out properly. There may be design constraints or post-lamination processes that prohibit cleaning once the substrates are laminated together. For example, there may not be enough room between the laminated substrates for the cleaning tools to reach the overflowed adhesive. Therefore, it is desirable to have a better mechanism to control the boundary of liquid adhesive to avoid overflow and underfill during fabrication.

SUMMARY

This relates to controlling the boundary of spreading liquid adhesive to prevent overflow and/or underfill from occurring during fabrication of electronic devices. In particular, a UV emitter can be used to pre-cure or full-cure (both referred to simply as "cure" in the remaining portion of this disclosure) liquid adhesive spreading over a surface of a substrate. A segmented shutter or mask can be positioned between the UV emitter and the liquid adhesive to selectively block the UV light from reaching the liquid adhesive at various times and/or locations. In the areas where the liquid adhesive is exposed to the UV light, the liquid adhesive can be cured instantly, thus preventing the adhesive from spreading further. In contract, in the areas where the UV light is blocked by the shutter, the liquid adhesive can continue to spread until either reaching a UV-exposed area or until equilibrium is reached. In some embodiments, a monitoring system can be equipped to monitor the movement of the liquid adhesive in real time. Based on the observed movement pattern, a controller can actively open and close individual segments of the shutter to direct UV light onto the areas where the adhesive has reached an intended boundary. This process can continue until the liquid adhesive fills the area defined by this boundary.

DETAILED DESCRIPTION

In the following description of preferred embodiments, reference is made to the accompanying drawings which form a part hereof, and in which it is shown by way of illustration specific embodiments in which the disclosure can be practiced. It is to be understood that other embodiments can be used and structural changes can be made without departing from the scope of the embodiments of this disclosure.

This relates to controlling the boundary of spreading liquid adhesive to prevent overflow and/or underfill from occurring during fabrication of electronic devices. In particular, a UV emitter can be used to pre-cure or full-cure (both referred to simply as "cure" in the remaining portion of this disclosure) liquid adhesive spreading over a surface of a substrate. A segmented shutter or mask can be positioned between the UV emitter and the liquid adhesive to selectively block the UV light from reaching the liquid adhesive at various times and/or locations. In the areas where the liquid adhesive is exposed to the UV light, the liquid adhesive can be cured instantly, thus preventing the adhesive from spreading further. In contract, in the areas where the UV light is blocked by the shutter, the liquid adhesive can continue to spread until either reaching a UV-exposed area or until equilibrium is reached. In some embodiments, a monitoring system can be equipped to monitor the movement of the liquid adhesive in real time. Based on the observed movement pattern, a controller can actively open and close individual segments of the shutter to direct UV light onto the areas where the adhesive has reached an intended boundary. This process can continue until the liquid adhesive fills the area defined by this boundary.

FIGS. 1a-1e illustrate a typical lamination process during device fabrication and the change in the spread pattern of the liquid adhesive used in the process. These figures illustrate both overflow and underfill of the adhesive due to the non-uniform spread of the adhesive when pressed between two substrates. The substrates illustrated in these figures and subsequent figures can be rigid (e.g., glass) or flexible (e.g., plastic). They can be the base substrates from which various layers such as the display layer and the touch panel layers of the device are made.

Figure 1A:
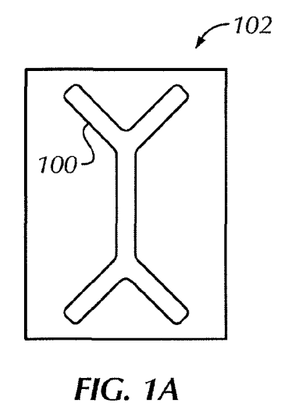
FIGS. 1a-1e illustrate a typical lamination process during device fabrication, and the change in the spread pattern of the liquid adhesive used in the process.

FIG. 1a. illustrates an exemplary initial dispense pattern 100 of liquid adhesive on a surface of a first substrate 102. The initial dispense pattern 100 can be in any shape or form. However, as detailed later in this disclosure, the initial pattern 100 can be optimized to develop a relatively predictable spread pattern of the adhesive during the lamination process. For example, the double-Y dispense pattern 100 shown in FIG. 1a has been found to be one of the more optimal dispense patterns for producing a relatively even spread pattern of the adhesive.

Figure 1B:
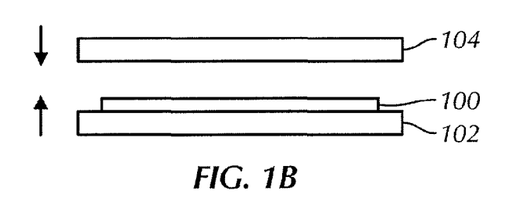
Figure 1C:
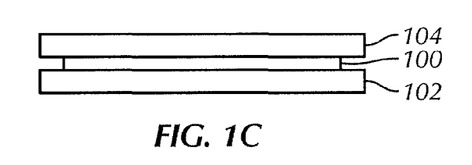

FIG. 1b provides a side view of the first substrate 102 of FIG. 1a. As illustrated, the layer of liquid adhesive 100 is deposited on top of the first substrate 102. During lamination process, the first substrate 102 can be aligned with a second substrate 104 such that the adhesive 100 on the first substrate is facing the bottom surface of the second substrate 104. The two substrates 102, 104 can be brought towards and pressed against each other to form a sandwich. As illustrated in FIG. 1c, when the two substrates 102, 104 are pressed against each other, the liquid adhesive 100 naturally starts to spread outward towards the edges of the substrates.

Although the initial dispense pattern may somewhat dictate how the liquid adhesive 100 spreads when squeezed by the two substrates 102, 104, due to the random nature of the way liquid flows and other factors such as the geometric and surface condition of the substrate, the liquid adhesive 100 is unlikely to spread in a completely uniform and predictable manner that maintains the initial dispense pattern. As shown in the top view of FIG. 1d, the overall pattern of the liquid adhesive 100, as it spreads outward, can be substantially different from the initial double-Y pattern shown in FIG. 1a.

Figure 1D:
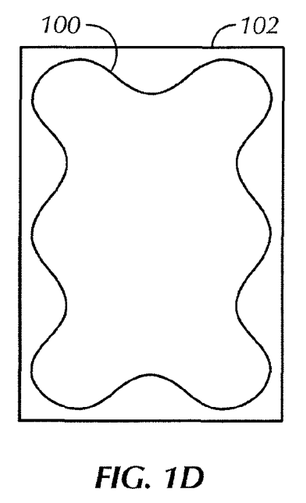

Conventionally, a UV emitter can be turned on after the liquid adhesive has been spreading for a certain period of time. The UV light from the emitter can cure the liquid adhesive, stopping it from spreading further. This period of time typically corresponds to the duration it takes for the adhesive to spread from the initial dispense pattern to the edge area of the substrate and can usually be determined via repeated trials. When the UV emitter is turned on, the entire layer of liquid adhesive is usually exposed to the UV light and cured at the same time. Because of the non-uniform movement of the liquid adhesive 100, when the adhesive is exposed to UV light, the boundary of the cured adhesive will likely not conform to any particular shape.

Figure 1E:
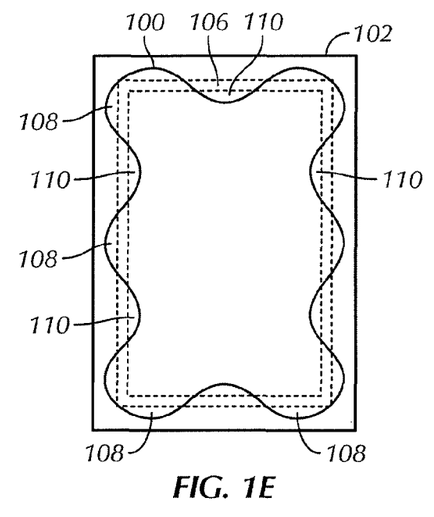

Ideally, the boundary of the cured adhesive should be uniform and without any overflow or underfill areas. For example, FIG. 1e illustrates a band 106 (shown in dotted lines) marking an ideal area within which the boundary of the liquid adhesive should be located when the adhesive is cured. The width of the band 106 can vary in different types of devices. In smaller devices such as smartphones, the band 106 can be very narrow due to the already narrow edge area around the screen. Thus, conventional methods such as cleaning the overflow area may be difficult, if not impossible, to perform. More precise boundary control mechanisms are needed.

As shown in FIG. 1e, the actual boundary of the cured liquid adhesive 100 is unlike to fall completely within the band 106 due to the uncontrolled spread of the adhesive 100. As a result, the liquid adhesive 100 may overflow pass the band 106 in some areas 108 while failing to reach the band in other areas 110. As discussed above, this non-uniform spread (i.e., overflow or underfill) of the liquid adhesive can result in various defects in the final product. The embodiments discussed below address this issue by providing various mechanisms to control the boundary of liquid adhesive as it spreads between two substrates.

In the embodiments of this disclosure, instead of exposing the entire liquid adhesive layer to UV light at the same time, various mechanisms are developed to selectively expose certain boundary areas of the adhesive to UV light to stop further advance of the liquid adhesive in those areas while blocking the UV light in other areas to allow the adhesive to continue to spread freely. More specifically, the areas that would typically overflow can be UV-cured sooner than those areas that would typically underfill. As a result, the final boundary of the liquid adhesive can be substantially uniform (e.g., in straight lines), when completely cured.

Figure 2:
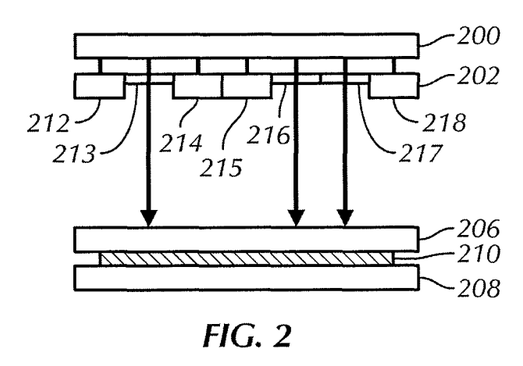
FIG. 2 illustrates an exemplary setup of a UV emitter and segmented shutter for controlling the boundary of liquid adhesive during lamination according to embodiments of the disclosure.

In one embodiment, a segmented shutter can be positioned between the UV emitter and the liquid adhesive. FIG. 2 illustrates an exemplary UV emitter 200 with a segmented shutter 202 positioned directly over a stack of two substrates 206, 208 being laminated together by the liquid adhesive 210 between them. In this embodiment, the top substrate 206 can be transparent. The segmented shutter 202 can include a number of segments 212-218, each of which can be individually opened or shut to control the UV emission 204 from the emitter 200. In various embodiments, the segments of the shutter can be controlled mechanically, electronically, or by any suitable means. Although the shutter 202 is shown to have seven rectangular segments 212-218, it should be understood that the number of segments and the shape and size of the segments can vary in different embodiments. For example, a large number of smaller segments may be optimal if fine control of the adhesive boundary is desired. The number of segments can also depend on the size of the substrates 206, 208 and the amount of liquid adhesive 210 dispensed.

As illustrated, some of the segments 212, 214, 215, 218 can be shut to block the UV light from the UV emitter 200 from reaching the areas of the liquid adhesive directly under those segments 202. As a result, the liquid adhesive 210 in those areas is not cured and can continue to move freely. In contrast, segments 213, 216, 217 can be in a open position to allow the UV light to pass through onto the liquid adhesive 210 in the areas directly below these segments 213, 216, 217. The liquid adhesive in the area under segments 213, 216, 217 can thus be cured by the UV light and stop spreading further.

Figure 3:
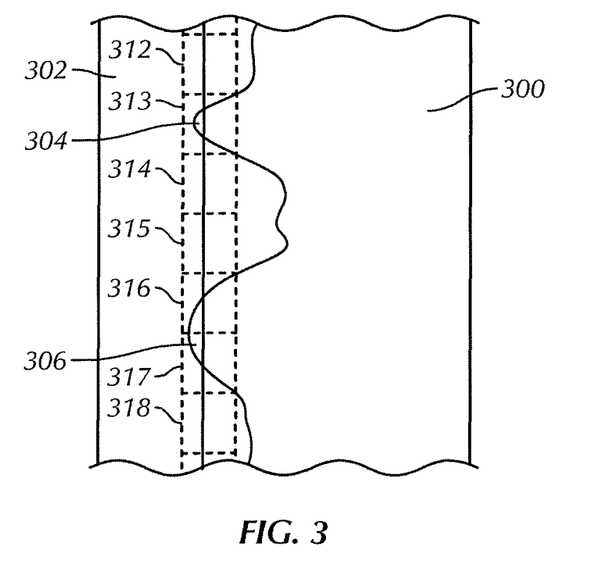
FIG. 3 is a partial top view illustrating the spread pattern of liquid adhesive over a surface of a substrate and the controlled boundary of the adhesive according to embodiments of the disclosure.

To control the boundary of the liquid adhesive as it spreads, the segments 212-218 of the shutter 202 can be aligned with a band marking the desired boundary in the border area of one of the substrates 206, 208, although in other embodiments, a two-dimensional array of shutter segments (not shown) can also be employed for additional shape control over the boundary of the cure adhesive. FIG. 3 provides a partial top view the stacked structure of FIG. 2. The sections 312-318 along the border area 302 of the substrate can sections of the band marking the desired boundary of the adhesive. Each section 312-318 can be aligned directly under a corresponding segment 213-218 of the shutter above. As illustrate, the liquid adhesive 300 has spread into the border area 302 in a few sections 313, 316, 317. In response, the corresponding segments 213, 216, 217 of the shutter (shown in FIG. 2) can be opened to allow the UV light from the emitter 200 to reach these sections 313, 316, 317. The UV light can in turn cure the adhesive almost instantly in these sections 313, 316, 317 and thus prevent it from spreading further into the border area 302.

In contrast, the segments 212, 214, 215, 218 of the shutter located above sections 312, 314, 315, 318 can remain shut because the adhesive 300 has not reached these sections 312, 314, 315, 318 of the border area 302. Therefore, sections 312, 314, 315, 318 are not exposed to UV light and the adhesive can continue to spread further in the direction of these sections 312, 314, 315, 318. When the adhesive finally spreads into the border area in one or more of these sections 312, 314, 315, 318, the corresponding segments of the shutter can be opened and allow the UV light to pass through. By UV-curing liquid adhesive only in the areas that have reached the band marking a desired boundary, the embodiments disclosed herein can provide more precise mechanisms to form a more uniform boundary of liquid adhesive in lamination processes.

Figure 4:
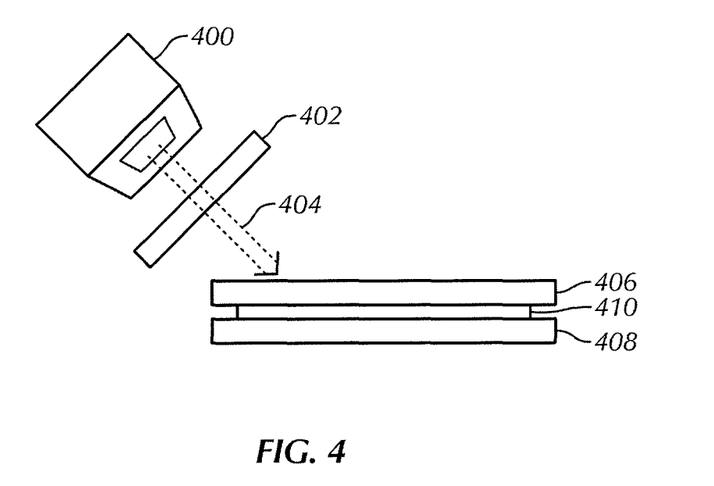
FIG. 4 illustrates another exemplary setup of a UV emitter and segmented shutter for controlling the boundary of liquid adhesive during lamination according to embodiments of the disclosure.

Although FIGS. 2 and 3 illustrate that the UV emitter 200 and the shutter 202 are positioned in a top down position directly above the stacked structure, it should be understood that they can be implemented in any orientation. For example, FIG. 4 illustrates a UV emitter 400 with a segmented shutter 412 positioned obliquely with respect to the surface of the stacked substrates 406, 408 and adhesive layer 410 between them. The top substrate 406 can be transparent. As in the previous embodiment, the UV light from the emitter 400 can be directed to a band marking a desired boundary of the liquid adhesive. Because the UV light can reach the liquid adhesive at an angle (when the segments of the shutter are open), the band marking the desired boundary of the liquid adhesive can be slightly closer to the edge or slightly farther away from the edge of the substrates. In some embodiments, it is preferable to have the band located closer to the edge of the substrates to allow the liquid adhesive to advance a bit further, passing the inner boundary of the border area. This can better hide the boundary line of the adhesive underneath the border area which is often opaque so that even when a user is viewing the screen at an oblique angle, the boundary line would not be visible.

Figure 5:
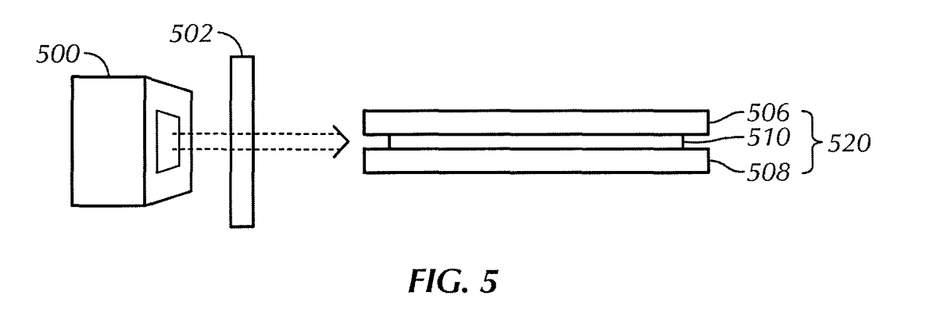
FIG. 5 illustrates yet another exemplary setup of a UV emitter and segmented shutter for controlling the boundary of liquid adhesive during lamination according to embodiments of the disclosure.

FIG. 5 illustrates another embodiment in which the UV emitter 500 and the segmented shutter 502 can be positioned facing the side of the stacked structure 520. This can allow the UV light from the emitter 500 to reach the liquid adhesive layer 510 even if both substrates 506, 508 are opaque. In this embodiment, a set of UV emitters and shutters may need to be positioned at all four sides of the stacked structure 520. In another embodiment, the UV emitter and the segmented shutter can be positioned facing the bottom of the stacked structure.

Figure 6:
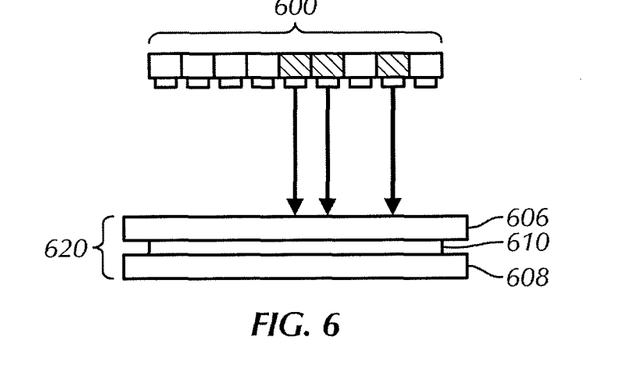
FIG. 6 illustrates using an array of individually controlled UV emitters to control the boundary of liquid adhesive during lamination according to embodiments of the disclosure.

Although the above-described embodiments all require at least one UV emitter and a shutter with multiple independent segments to control the boundary of liquid adhesive, it should be understood that the same effect can be achieved by using an array of independent UV emitters that can be individually turned on and off. As illustrated in FIG. 6, the array of UV emitters (collectively 600) can be aligned over the top of the border area of the stacked structure 620. Each of the emitters 600 can be turned on or off according to the spread pattern of the adhesive. When an emitter is turned on, UV light can be emitted onto the section in the border area directly underneath the emitter. FIG. 6 shows three of the emitters 600 are turned on and the areas of the adhesive 610 under these emitters can be exposed to UV light from these emitters 600 and be cured. In this embodiment, no segmented shutter may be required.

Figure 7:
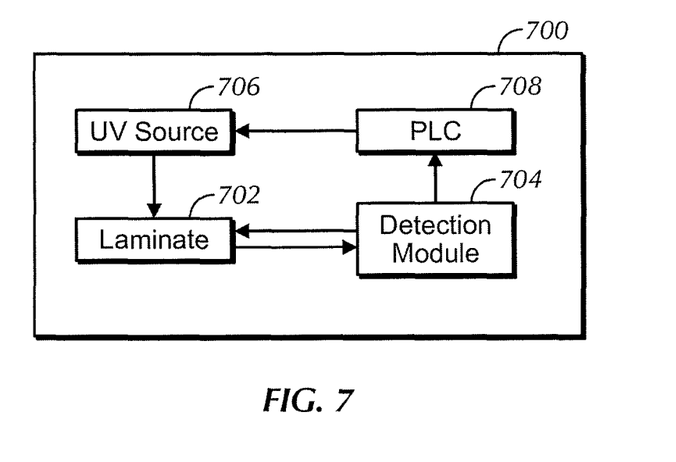
FIG. 7 is a block diagram illustrating exemplary components of an active shutter control system for controlling the boundary of spreading liquid adhesive during lamination according to embodiments of the disclosure.

Another aspect of this disclosure relates to control mechanisms for the segmented shutter (or a UV emitter array such as the one shown in FIG. 6). In one embodiment the spread of the liquid adhesive can be monitored by a detection module in real time. Based on the observed progression of the boundary of the adhesive, a controller can actively open or shut one or more segments of the shutter (or turn on or off one or more of the emitters in the array) to dynamically control UV curing of the adhesive in different areas. FIG. 7 is a block diagram illustrating the components of an exemplary active shutter control system 700. As illustrated, the active shutter control system 700 can include a UV source 706 equipped with segmented shutter (not shown separately) such as those shown in FIGS. 2, 4, and 5. The UV source 706 can be positioned to emit UV light to the liquid adhesive in a laminate 702. As mentioned above, the liquid adhesive can be cured when exposed to UV light.

The active shutter control system 700 can include a detection module 704 that can monitor the spread of the liquid adhesive in the laminate 702 in real time. The detection 700 module can be an optical detection system. In one embodiment, the detection module can include a camera capable of tracking the flow of the adhesive. If the top substrate is transparent, the camera can be positioned over the top of the laminate 702 to capture an overhead view of progression of the liquid adhesive. In particular, the camera can capture where the boundary of the liquid adhesive is at a particular time. Alternatively, if the top substrate is opaque, the camera can be positioned on the side of the laminate. The boundary of the adhesive can be determined based on the focal length of the lens of camera. In other embodiments, the detection module can be designed to detect the moving boundary of the liquid adhesive by other means such as the optical properties of the adhesive. For example, if the adhesive can reflect a certain amount of infrared (IR) light, an IR transmitter/receiver array can be used to emit IR light and detect when IR light is being reflected off of adhesive appearing in a boundary section of the laminate.

The detection module 704 can be connected to a controller such as a programmable logic controller (PLC) 708. In some embodiments, the detection module 704 can feed, either continuously or at preset time intervals, the detected spread pattern of the liquid adhesive as captured by a camera or other means to the PLC 708. The PLC 708 can include firmware/software for analyzing the spread pattern to determine whether the boundary of the liquid adhesive has reached a predetermined band marking the desired boundary, such as the one shown in FIG. 1e. If it has, the PLC 708 can further determine the specific sections of the band into which the liquid adhesive has spread. As illustrated in FIG. 7, the PLC 708 can be connected to the segmented shutter of the UV source 706. If breach into one or more of the sections of the band is detected and the sections identified, the PLC 708 can actively open the corresponding segment(s) of the shutter to initiate UV curing of the liquid adhesive in those sections. This in turn prevents the liquid adhesive from spreading beyond the band, thus effectively preventing overflow from occurring. As the liquid adhesive continue to reach the band in various sections, the PLC 708 can dynamically open and close the corresponding segments of the shutter of the UV source 706 to form a desired boundary of the liquid adhesive when it is cured.

Because the active shutter control system 700 can monitor the flow of the liquid adhesive in real time and quickly adjust the segments of the shutter in response to the monitored flow, and because liquid adhesive can be UV cured almost instantaneously, precise boundary control can be achieved where the final boundary of the UV-cured liquid adhesive can substantially conform to the predetermined boundary band.

While the active shutter control system 700 does not directly prevent underfill, underfill is relatively easy to fix and can be eliminated by optimizing the initial dispense pattern of the liquid adhesive. More specifically, even though the exact spread pattern of the adhesive may be difficult to predict, the spread pattern from the same initial dispense pattern can be relatively consistent and thus predictable to some extent. For example, the double-Y dispense pattern shown in FIG. 1 a may consistently spread in a pattern similar to the one shown in FIG. 1d. Thus, the initial dispense pattern of the adhesive can be designed, through trial, to guarantee that the adhesive can at the minimum reach the predetermined boundary band in all directions. This in combination with the active shutter control system of FIG. 7 can prevent both underfill and overflow from occurring.

In another embodiment, using the same principle described in the last paragraph, a time-based mechanism can be used for controlling the shutter of a UV source to control the boundary of liquid adhesive during lamination. This can work effectively, especially for a repeating pattern of spreading. As discussed above, a general and relatively consistent spread pattern can be determined from an initial dispense pattern based on repeated trials. Accordingly, a time duration from the initial dispense of the liquid adhesive until the edge of the adhesive reaches each section of the predetermined boundary band can be recorded. In some embodiments, the start of the time duration can be set to when the second substrate is pressed onto the liquid adhesive, effectively starting the spread of the adhesive.

Figure 8:
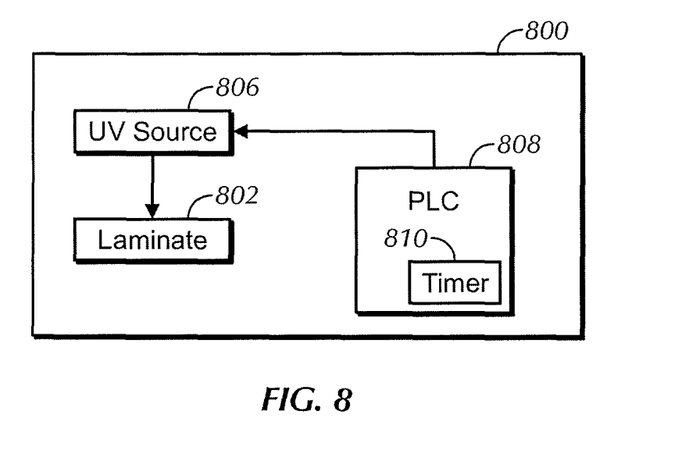
FIG. 8 is a block diagram illustrating exemplary components of a time-based shutter control system for controlling the boundary of spreading liquid adhesive during lamination according to embodiments of the disclosure.

FIG. 8 illustrates a time-based shutter control system for controlling the boundary of the spreading liquid adhesive. The time-based shutter control system 800 can include a UV source 806 with a segmented shutter (not shown separately) for emitting UV light to a laminate 802 including a layer of liquid adhesive. The system 800 can also include a controller such as a PLC (808) for controlling the individual segments of the shutter. However, this embodiment is different from the one shown in FIG. 7 in that the time-based shutter control system 800 does not include a detection module for monitoring the spreading of the liquid adhesive in real time. Instead of controlling the shutter based on the real-time flow pattern of the adhesive, the PLC 808 in this embodiment can be programmed to open and shut each segment of the shutter at various times based on the known spread pattern of the adhesive from a particular initial dispense pattern. For example, some of the segments of the shutter can be opened early to allow UV to reach areas where the adhesive is known to spread the fastest based on the normal spread pattern from the particular initial dispense pattern. Other segments of the shutter can be programmed to open at later times because these segments are over areas where spreading has been empirically determined to be slower based on the same known spread pattern. The PLC 808 can be synchronized with the initial dispense of the adhesive or the start of the lamination process using a timer 810.

The time-based shutter control system 800 can be relatively simple and inexpensive to implement because no detection module is required to monitor the spread of the liquid adhesive. It can achieve the same level of boundary control as the active shutter control system, particularly for a repeating pattern of spreading that is relatively consistent and predictable.

In some embodiments, as an alternative to the segmented shutter, one or more static masks designed based on the known spread pattern can be inserted and removed between the UV source and the liquid adhesive to achieve the same boundary control effects based on the same concept discussed above.

Figure 9A:
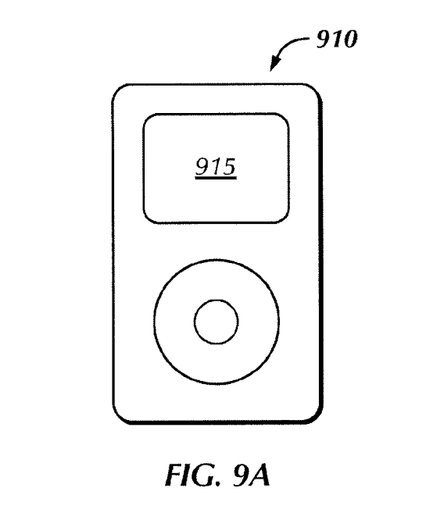
FIG. 9a illustrates an exemplary digital media player including panels laminated using liquid adhesive, the boundary of which is controlled according to embodiments of the disclosure.

FIG. 9a illustrates exemplary digital media player 910 that can include a screen 915 including multiple panels such as a touch sensor panel, display panel, cover glass that are laminated using liquid adhesive wherein the boundary of the liquid adhesive can be controlled according to embodiments of the disclosure.

Figure 9B:
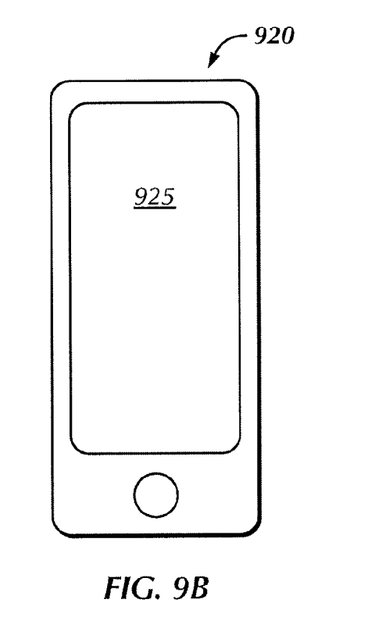
FIG. 9b illustrates an exemplary mobile telephone including panels laminated using liquid adhesive, the boundary of which is controlled according to embodiments of the disclosure.

FIG. 9b illustrates exemplary mobile telephone or tablet 920 that can include a screen 925 including multiple panels such as a touch sensor panel, display panel, cover glass that are laminated using liquid adhesive wherein the boundary of the liquid adhesive can be controlled according to embodiments of the disclosure.

Figure 9C:
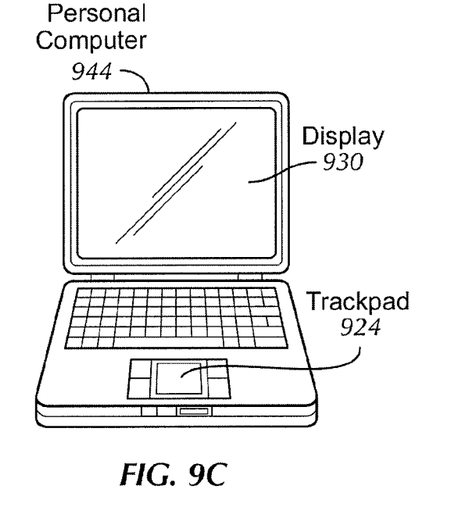
FIG. 9c illustrates an exemplary mobile computer including panels laminated using liquid adhesive, the boundary of which is controlled according to embodiments of the disclosure.

FIG. 9c illustrates an exemplary personal computer 944 that can include touch sensor panel 924 and display device 930. The touch sensor panel 924 and the display device can include one or more panels laminated using liquid adhesive wherein the boundary of the liquid adhesive can be controlled according to embodiments of the disclosure.

Figure 9D:
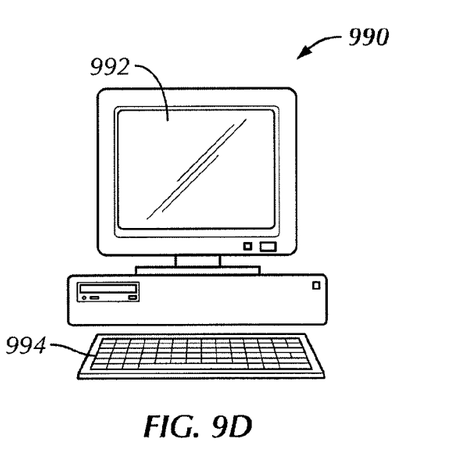
FIG. 9d illustrates an exemplary desktop computer including panels laminated using liquid adhesive, the boundary of which is controlled according to embodiments of the disclosure.

FIG. 9d illustrates a desktop computer 990 including a display device 992. The display device 992 and a virtual keyboard 994, both of which can include one or more panels laminated using liquid adhesive wherein the boundary of the liquid adhesive can be controlled according to embodiments of the disclosure.

Figure 10:
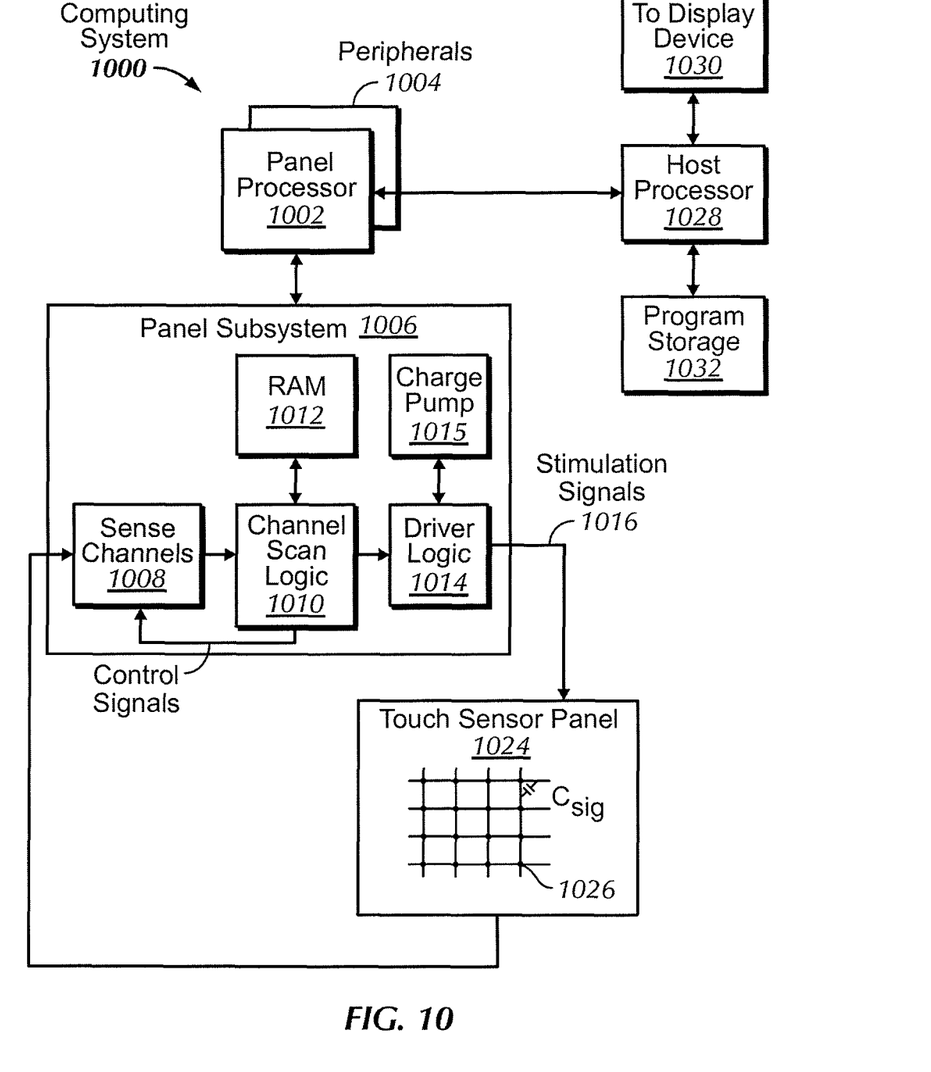
FIG. 10 illustrates an exemplary computing system including a touch sensor panel laminated to another panel or components using liquid adhesive, the boundary of which is controlled according to embodiments of the disclosure.

FIG. 10 illustrates exemplary computing system 1000 that can include one or more touch sensor panels laminated to a display panel, a cover glass, or another component using liquid adhesive. The boundary of the liquid adhesive can be controlled during fabrication according to the embodiments of the disclosure described above. Computing system 1000 can include one or more panel processors 1002 and peripherals 1004, and panel subsystem 1006. Peripherals 1004 can include, but are not limited to, random access memory (RAM) or other types of memory or storage, watchdog timers and the like. Panel subsystem 1006 can include, but is not limited to, one or more sense channels 1008, channel scan logic 1010 and driver logic 1014. Channel scan logic 1010 can access RAM 1012, autonomously read data from the sense channels and provide control for the sense channels. In addition, channel scan logic 1010 can control driver logic 1014 to generate stimulation signals 1016 at various frequencies and phases that can be selectively applied to drive lines of touch sensor panel 1024. In some embodiments, panel subsystem 1006, panel processor 1002 and peripherals 1004 can be integrated into a single application specific integrated circuit (ASIC).

Touch sensor panel 1024 can include a capacitive sensing medium having a plurality of drive lines and a plurality of sense lines, although other sensing media can also be used. Either or both of the drive and sense lines can be coupled to a thin glass sheet according to embodiments of the disclosure. Each intersection of drive and sense lines can represent a capacitive sensing node and can be viewed as picture element (pixel) 1026, which can be particularly useful when touch sensor panel 1024 is viewed as capturing an "image" of touch. (In other words, after panel subsystem 1006 has determined whether a touch event has been detected at each touch sensor in the touch sensor panel, the pattern of touch sensors in the multi-touch panel at which a touch event occurred can be viewed as an "image" of touch (e.g. a pattern of fingers touching the panel).) Each sense line of touch sensor panel 1024 can drive sense channel 1008 (also referred to herein as an event detection and demodulation circuit) in panel subsystem 1006.

Computing system 1000 can also include host processor 1028 for receiving outputs from panel processor 1002 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 1028 can also perform additional functions that may not be related to panel processing, and can be coupled to program storage 1032 and display device 1030 such as an LCD panel for providing a UI to a user of the device. Display device 1030 together with touch sensor panel 1024, when located partially or entirely under the touch sensor panel, can form touch screen 1018.

Note that one or more of the functions described above can be performed by firmware stored in memory (e.g. one of the peripherals 1004 in FIG. 10) and executed by panel processor 1002, or stored in program storage 1032 and executed by host processor 1028. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium that can contain or store the program for use by or in connection with the instruction execution system, apparatus, or device. The non-transitory computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Although embodiments of this disclosure have been fully described with reference to the accompanying drawings, it is to be noted that various changes and modifications will become apparent to those skilled in the art. Such changes and modifications are to be understood as being included within the scope of embodiments of this disclosure as defined by the appended claims.

What is claimed is:

1. A system for controlling a boundary of spreading liquid adhesive on a surface, comprising:
    one or more ultra-violet (UV) sources configurable to emit UV light onto the liquid adhesive;
    a detection circuit, comprising:
        an infrared transmitter that emits infrared light onto the liquid adhesive; and
        an infrared receiver that receives infrared light that is reflected off the liquid adhesive and that detects locations at which the boundary of the liquid adhesive has spread beyond a predetermined region on the surface;
    a control circuit coupled to the one or more UV sources, wherein upon detecting that the boundary of the liquid adhesive has spread beyond the predetermined region, the detection circuit is configured to send a signal to the control circuit to control the one or more UV sources to selectively apply the UV light only at the detected locations on the liquid adhesive to cure the adhesive and prevent the boundary of the adhesive from further spreading beyond the predetermined region.

2. The system of claim 1, further comprising a shutter with one or more segments positioned between the UV source and the liquid adhesive, the one or more segments of the shutter configurable under control of the control circuit to block the UV light from reaching the detected locations of the liquid adhesive when in a closed state and apply the UV light to the detected locations when in an open state.

3. The system of claim 2, wherein the one or more segments are configured to independently switch between the open state and the closed state.

4. The system of claim 1, wherein the control circuit is configured to control the one or more UV sources by selectively turning the one or more UV sources on and off at the detected locations.

5. The system of claim 1, wherein the detection circuit further comprises a camera.

6. The system of claim 1, wherein the detection circuit is configured to monitor a spread pattern of the liquid adhesive in real time.

7. The system of claim 1, wherein the detection circuit is coupled to the control circuit and configured to feed a detected spread pattern of the liquid adhesive to the control circuit.

8. The system of claim 7, wherein the control circuit is configured to control the one or more UV sources based on the detected spread pattern.

9. The system of claim 2 or 4, further comprising a timer configured to trigger the control circuit to apply or block the UV light to the detected locations.

10. The system of claim 9, wherein the timer is configured to trigger the control circuit based on a known spread pattern of the liquid adhesive.

11. The system of claim 10, wherein the known spread pattern is determined based on an initial dispense pattern of the liquid adhesive.

12. The system of claim 1, wherein the detected locations comprises a desired boundary area of the liquid adhesive.

13. The system of claim 1, wherein the UV source is positioned substantially over the top of the surface.

14. The system of claim 1, wherein the UV source is positioned substantially facing the side of the surface.

* * * * *